United States Patent
Hoyen et al.

(10) Patent No.: US 10,935,579 B2
(45) Date of Patent: Mar. 2, 2021

(54) CURRENT SENSOR

(71) Applicant: ATLAS COPCO AIRPOWER, NAAMLOZE VENNOOTSCHAP, Wilrijk (BE)

(72) Inventors: Damien Franck Hoyen, Wilrijk (BE); Tom Corneel Elise Bierhuys, Wilrijk (BE)

(73) Assignee: ATLAS COPCO AIRPOWER, NAAMLOZE VENNOOTSCHAP, Wilrijk (BE)

( * ) Notice: Subject to any disclaimer, the term of this patent is extended or adjusted under 35 U.S.C. 154(b) by 0 days.

(21) Appl. No.: 16/438,618

(22) Filed: Jun. 12, 2019

(65) Prior Publication Data
US 2019/0383862 A1    Dec. 19, 2019

Related U.S. Application Data

(60) Provisional application No. 62/686,139, filed on Jun. 18, 2018.

(30) Foreign Application Priority Data

Aug. 7, 2018    (BE) .................................. 2018/5556

(51) Int. Cl.
*G01R 19/165*    (2006.01)
*G01R 19/25*    (2006.01)
(Continued)

(52) U.S. Cl.
CPC ....... *G01R 19/16571* (2013.01); *G01R 15/14* (2013.01); *H04Q 9/00* (2013.01); *H04Q 2209/40* (2013.01)

(58) Field of Classification Search
None
See application file for complete search history.

(56) References Cited

U.S. PATENT DOCUMENTS

| | | | |
|---|---|---|---|
| 6,975,926 B2 | 12/2005 | Schanin | |
| 2003/0076744 A1* | 4/2003 | Zick | G07C 3/04 368/9 |

(Continued)

FOREIGN PATENT DOCUMENTS

| | | |
|---|---|---|
| DE | 4413028 A1 | 10/1995 |
| EP | 1691336 A2 | 8/2006 |

(Continued)

OTHER PUBLICATIONS

Kumar, Energy and Water Monitoring System for Smart Metering and Consumer Awareness, Department of Electronics Engineering, Fiji National University, Fiji, Nov. 5, 2015 (Year: 2015).*

(Continued)

*Primary Examiner* — Curtis A Kuntz
*Assistant Examiner* — Jerold B Murphy
(74) *Attorney, Agent, or Firm* — Bacon & Thomas, PLLC (57) ABSTRACT

A current sensor including a housing, the housing including a first module adapted to be clamped around a wire part of a power cable; a second module having a processing unit and a communication unit; the first module further including a device to measure the current through the wire of said power cable and to send the measured current to the processing unit through a first communication link. The processing unit includes a first time tracker; where the processing unit further includes software/hardware to increment the first time tracker if the measured current is above a first predetermined threshold and in that the communication unit includes a GSM module adapted to wirelessly transmit the value of the first time tracker.

20 Claims, 2 Drawing Sheets

(51) Int. Cl.
G01R 19/17 (2006.01)
G01R 19/18 (2006.01)
G01R 15/14 (2006.01)
H04Q 9/00 (2006.01)

(56) References Cited

U.S. PATENT DOCUMENTS

| | | | |
|---|---|---|---|
| 2010/0273462 A1* | 10/2010 | Thorn | H04W 8/26 |
| | | | 455/414.1 |
| 2013/0128396 A1* | 5/2013 | Danesh | G01R 19/00 |
| | | | 361/45 |
| 2015/0137596 A1 | 5/2015 | Steiner-Jovic et al. | |
| 2016/0204617 A1 | 7/2016 | Gilbert et al. | |
| 2016/0238638 A1 | 8/2016 | Scheiermann | |
| 2016/0313377 A1 | 10/2016 | Bolin et al. | |
| 2016/0377509 A1 | 12/2016 | Cloake | |
| 2019/0324071 A1* | 10/2019 | Poiron | G01R 15/183 |

FOREIGN PATENT DOCUMENTS

| | | | |
|---|---|---|---|
| EP | 3045922 A1 | | 7/2016 |
| KR | 9503873 | * | 4/1995 |
| KR | 20020024588 A | | 3/2002 |
| KR | 20170131911 A | | 12/2017 |
| WO | 2017178970 A1 | | 10/2017 |
| WO | 2017220887 A1 | | 12/2017 |

OTHER PUBLICATIONS

Novelty and Search report in corresponding Belgium application 201805556, dated Mar. 11, 2019.

* cited by examiner

CURRENT SENSOR

This invention relates to a current sensor comprising a housing, said housing comprising:
- a first module adapted to be clamped around wire of a power cable;
- a second module comprising a processing unit and a communication unit;
- said first module further comprising means to measure the current through said wire and to send the measured current to the processing unit through a first communication link;
- the processing unit comprising a first time tracker.

BACKGROUND OF THE INVENTION

Devices measuring the current are used within the industry, like for example the one disclosed in US 2015/137,596. Such device measuring the current through a cable and sending the measurements to a management system through an internet network. The device further comprising a control unit capable to route energy that is harvested from the cable to a plurality of storing devices based on switch and load balancing decisions.

The above mentioned device not being the most simple and cost effective solution for sensing the current on a single device.

Moreover, because the device is sending the measured current, it requires a high amount of energy to function. Consequently, the above mentioned device comprises a plurality of energy storing units, increasing the manufacturing and potentially servicing costs of the device.

Furthermore, because all the measurements are being sent towards a management system, the above mentioned device is not capable of offering any information regarding the functioning of the unit on the cable of which it is connected without further processing. A user of such a device, would have to query the management system and analyze the raw data in order to extract relevant information from it. Such a step becoming cumbersome since the amount of data can easily become too big.

SUMMARY OF THE INVENTION

Taking the above drawbacks into account, it is an object of the present invention to provide a current sensor with a very simple topology, with a minimum number of components and which would not require additional cabling or a servicing procedure to be mounted.

The current sensor according to the present invention aiming at providing information concerning the functioning of the device connected to the power cable and help the user to identify when to schedule a servicing procedure based on his specific usage pattern.

The present invention aims at providing a current sensor that is easy to manufacture, is cost effective and is deployable in all geographical regions.

The present invention solves at least one of the above and/or other problems by providing a current sensor comprising a housing, said housing comprising:
- a first module adapted to be clamped around a power cable;
- a second module comprising a processing unit and a communication unit;
- said first module further comprising means to measure the current through said power cable and to send the measured current to the processing unit through a first communication link;
- the processing unit comprising a first time tracker;

wherein said processing unit further comprises means to increment said first time tracker if the measured current is above a first predetermined threshold and in that the communication unit comprises a GSM module adapted to wirelessly transmit the value of the first time tracker.

Because the processing unit comprises means to increment the first time tracker when the current is above a first predetermined threshold, and because the value of the first time tracker is the one transmitted through the GSM module, the current sensor according to the present invention is in fact reducing the amount of data sent through the GSM module in a very simple manner and without the risk of loosing important information. Accordingly, instead of sending every measurement, the current sensor is sending only a value representative for the device.

Because the amount of data sent is reduced, the energy consumption of the GSM module for the data transfer is reduced as well.

Preferably, the first time tracked comprises a first counter which is being incremented whenever the measured current is above a predetermined threshold.

By simply increasing the first counter, the technical requirements of the current sensor of the present invention are minimal, which means a reduced manufacturing cost and consequently a reduced maintenance cost.

Because the current sensor is incrementing a first counter whenever the measured current is above a predetermined threshold, the current sensor according to the present invention is capable of making a more complex analysis such as the number of hours in which the device connected to the power cable is functioning. Accordingly, the number of running hours of the device can be determined in a very simple and user friendly manner.

Because the current sensor uses a GSM module for transmitting the data, the complexity of the network is very low. Such network not requiring a repeater when transmitting the data or an additional gateway. The current sensor according to the present invention being capable to directly send the data to an external computer or the cloud.

Furthermore, a user of the current sensor would not need to come in the proximity of the device onto which the current sensor is connected in order to receive the data.

Consequently, the manufacturing costs of the present current sensor and the costs associated with providing and maintaining the network through which such current sensor is sending data, are even more reduced.

Preferably, the current sensor is mounted on a power cable of a device selected from a group comprising: a compressor, a vacuum pump, a dryer, or the like.

Currently, for such devices, the typical period for the servicing procedure is set at once or twice per year, depending on the type of device and the industry in which it is used. This period is selected as being the period after which the device is believed to have run for a certain amount of hours. But, by using a current sensor according to the present invention, such servicing procedure can be scheduled when the actual number of running hours have been used, which can delay the servicing procedure to, for example, once per year or once every two years.

Consequently, the servicing costs are reduced and the reliability of the device is increased, since a user of such a device can rely on it as being functioning for a longer period of time, without interruptions.

Because the current sensor has such a structure, it can be mounted in a rapid and non-invasive manner onto the power cable, without the need of a technician to come on site.

Preferably, the second module further comprises a capacitor adapted to be charged by the electrical energy harvested from the power cable.

By including a capacitor, the current sensor according to the present invention is self-powered.

Consequently, it does not need additional wires or connectors, it can be simply clamped around a wire of the power cable and used.

The present invention is further directed to a compressed gas network comprising a motor driving a compressor element and a power cable supplying electrical power to said motor, wherein the compressed gas network comprises a current sensor according to the present invention.

The present invention is also directed to a method for determining the functioning of a device driven by an electrical motor connected to a power cable by measuring the current through a wire part of said power cable, the method comprising the following steps:

providing a current sensor having a housing with a first module and a second module;

clamping the first module around a wire of the power cable;

providing a processing unit and a communication unit part of said second module;

measuring the current through the wire and sending the measured current to the processing unit through a first communication link;

wherein the method further comprises the steps of providing the processing unit with a first time tracker; comparing the measured current with a first predetermined threshold and incrementing a first counter of said first time tracker if the measured current is above the first predetermined threshold; whereby the method further comprises the step of transmitting the value of the first time tracker through a GSM module part of the communication unit.

The present invention is further directed to a use of a current sensor according to the present invention, for determining the running hours of a compressor or a dryer.

In the context of the present invention it should be understood that the benefits presented above with respect to the current sensor are also valid for the compressor or vacuum pump comprising the current sensor, to the method and the use of such current sensor.

BRIEF DESCRIPTION OF THE DRAWINGS

With the intention of better showing the characteristics of the invention, some preferred configurations according to the present invention are described hereinafter by way of an example, without any limiting nature, with reference to the accompanying drawings, wherein.

DETAILED DESCRIPTION OF THE INVENTION

Figure 1:
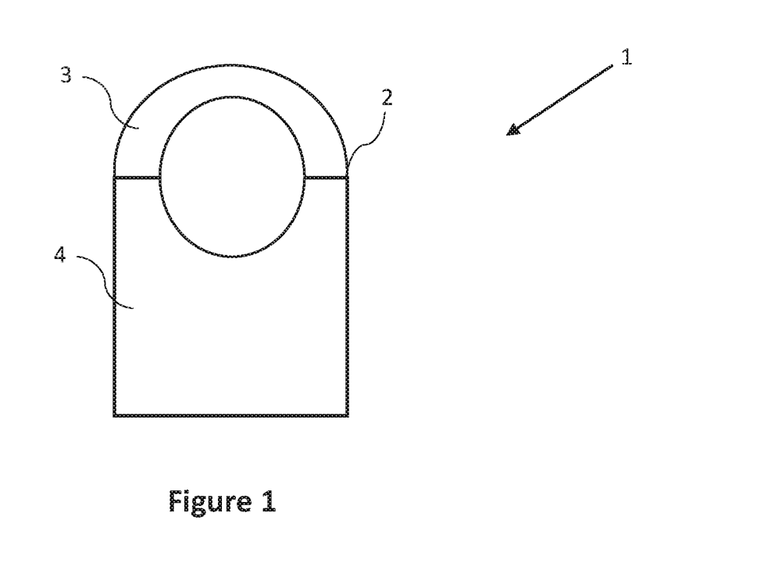
FIG. 1 schematically illustrates a current sensor according to an embodiment of the present invention.

FIG. 1 illustrates a current sensor 1 comprising a housing 2 having a first module 3 and a second module 4.

The first module 3 being clamped around a power cable 5.

The power cable 5 transporting electrical energy from a source such as, for example, the power grid or an electrical generator to a device such as for example: a gas compressor, a compressed gas dryer or a vacuum pump and allowing the device to function.

By clamped around the power cable, it is to be understood that the first module 3 covers an outer circular section of a wire part of the power cable, and can be locked or fixed in position through any means such as for example and not limiting thereto: a snap fit, a screw, a bolt, a fixing element such as a clip, by screwing the second module 4 onto the first module 3, by gluing or the like.

Preferably, the first module 3 is being clamped around only one wire of the power cord 5: either around the phase or around the null, for a mono phase cable.

In case the power cable 5 is a three phase cable, the current sensor 1 can be mounted on any one of the three wires.

Figure 2:
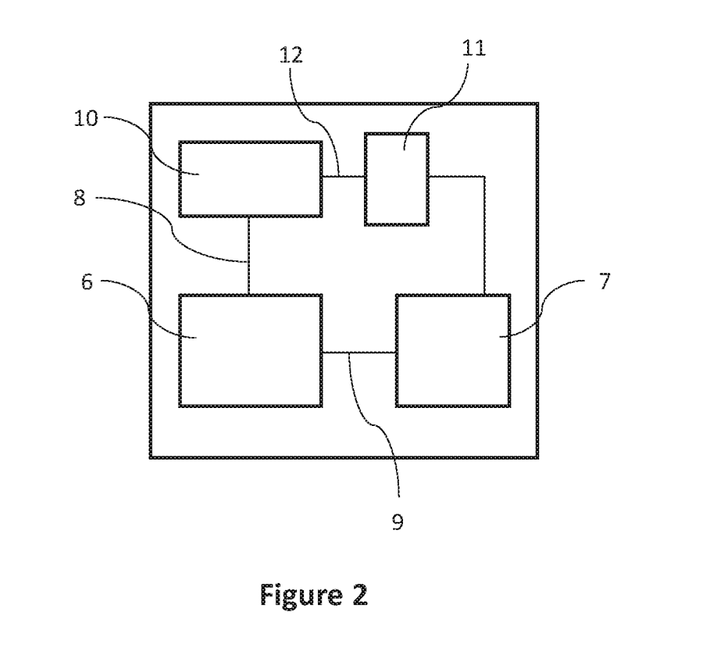
FIG. 2 schematically illustrates a second module according to an embodiment of the present invention.

The second module 4 comprising a processing unit 6 and a communication unit 7.

The first module 3 further comprising means to measure the current through the wire part of said power cable 5 and to send the measured current to the processing unit 6 through a first communication link 8.

By the means to measure the current it is meant that the first module 3 is capable to detect the electrical signal flowing through the wire part of the power cable 5, said signal comprising information concerning the intensity and/or the voltage of the current flowing therethrough. Further, from such detected signal, the value of the intensity of the current can be derived.

The first module 3 comprising for example and not limiting thereto: a Hall effect sensor, a transformer or current clamp meter, a fluxgate transformer type of sensor, a Rogowski coil, etc.

By a communication link it is meant an electrical connection such as an electrical conductor like for example an electrical wire or an electrical connection on a Printed Circuit Board (PCB). If the communication module comprises an electrical wire, said electrical wire typically comprises a connector at each end. Such communication link allowing data to be transferred between two components.

It is further not excluded that said communication link to be wireless, case in which the two components each comprise a transceiver or one component comprises a transmitter and the other component comprises a receiver.

Further, the processing unit 6 comprises a first time tracker.

Preferably, said first time tracker being reset as having a value of zero before the current sensor 1 is being clamped around the wire part of the power cable 5.

It should be however not excluded that said first time tracker can be initiated with a different value before being clamped around the wire, said value being representative of the actual number of hours the device had been running until then or an approximation thereof.

The processing unit 6 further comprising means to compare the measured current intensity with a first predetermined threshold, and if the result of the comparison shows that the value of the current intensity is above or equal to the first predetermined threshold, then the processing unit further comprises means to increment a first counter part of the first time tracker.

Preferably, the process of incrementing considers the last value of the first counter to which a first predetermined value is added.

Said first predetermined value being selected as any value or said first predetermined value being equal to the period of time in between two consecutive measurements of the current.

As an example, but not limiting thereto, the first predetermined value can be selected as any value between approximately one second and approximately ten minutes, more preferably between approximately five seconds and approximately five minutes, even more preferably between approximately ten seconds and approximately one minute.

In a preferred embodiment but not limiting thereto, the period of time in between two current measurements is chosen to be approximately ten seconds.

Consequently, if the result of the comparison shows that said current intensity is above or equal to the first predetermined threshold, then the processing unit adds ten seconds to the last value of the first counter.

If it is the first measurement, then the processing unit is adding ten seconds to zero, the new value of the first counter, which would be used in a subsequent step, being ten seconds. The process being a cyclic one until the first time tracker is being reset.

Preferably, the first time tracker is being reset after the servicing procedure is performed.

Further, the communication unit 7 comprises a GSM module adapted to wirelessly transmit the value of the first time tracker.

The communication unit 7 comprising a second communication link 9 receiving the value of the first time tracker from the processing unit 6.

Preferably, said GSM module further comprises a SIM card.

Preferably, but not limiting thereto, for an even more compact and easy to manufacture current sensor, the housing 2 encloses the first module 3 and the second module 4.

Further preferably, the housing 2 comprises a mobile section allowing for the first module 3 to be easily mounted around a wire part of the power cable 5.

Preferably, the second module 4 further comprises an energy transformation circuit 10 adapted to harvest electrical energy from the wire part of the power cable 5.

Said energy transformation circuit 10 being preferably capable of receiving a signal from the first module 3, and is capable of magnifying or reducing the harvested energy.

The first module typically comprising a first coil wound around a part of the first module 3 and allowing the first module to sense the magnetic field generated by the current flowing through the wire.

Further, an image of the current is induced in the current transformer part of the energy transformation circuit 10, said image of the current being sent to the processing unit 6 for further processing. The processing unit 6 extracting the value of the intensity of the current from the received image.

The energy transformation circuit 10 being further capable of harvesting energy from the image of the current.

Accordingly, the image of the current is used to convert current into voltage by using, for example, a current to voltage convertor.

Furthermore, the energy transformation circuit 10 is preferably using a voltage modulation technique to charge the capacitor 11. The voltage modulation comprising an AC (Alternating Current) to DC (Direct Current) and/or a DC (Direct Current) to DC (Direct Current) convertor.

Preferably, the level of the voltage being changed into another level of voltage, and energy is then transferred to a capacitor 11 part of the second module 4, for charging it.

The energy transformation circuit 10 is preferably supplying the necessary amount of energy to the processing unit 6 through the first communication link 8.

The energy transformation circuit 10 being connected to the capacitor 11 through a third communication link 12.

In a preferred embodiment according to the present invention, the capacitor 11 is adapted to supply the energy required for the GSM module to wirelessly communicate the value of the first time tracker.

Said capacitor 11, after being charged, preferably supplying the necessary energy to the communication unit 7 for wirelessly transmitting the value of the first time tracker.

Accordingly, the current sensor according to the present invention is self-powered, the user only needing to clamp it around a power cord.

Preferably, in order to allow the capacitor to be charged, the current sensor 1 according to the present invention is allowed to be clamped around the wire for a minimum period of time while the device is functioning, before the first value of the first time tracker is sent.

The capacitor 11 being selected as any type of capacitor. Preferably, said capacitor being of a type resistant to temperatures and vibrations typically generated by a compressor, vacuum pump or a dryer and having a long operational life.

Concerning their capacitance, the current sensor 1 according to the present invention can use any capacitor 11 that can provide enough energy for the transfer of data through the GSM module, such as for example and not limiting thereto, a capacitor of a capacitance selected between one Farad and twenty Farad, more preferably, between ten Farad and fifteen Farad.

In another embodiment according to the present invention, the second module 4 further comprises a memory module (not shown) comprising a data link to the processing unit 6 and adapted to store the value of the first time tracker.

Consequently, the current sensor 1 can transmit the value of the first time tracker after a preset time interval, depending on the user's requirements.

Said preset time interval being selected as any time interval selected between for example a couple of hours and a couple of days.

In a preferred embodiment but not limiting thereto, said preset time interval being selected as one every 24 hours.

Such an approach reduces even more the energy consumption since the wireless communication is not initiated after every measurement of the current intensity, but after said preset time interval.

Preferably, once the wireless communication is initiated, the communication unit sends the last value of the first time tracker.

In case needed, the users can also retrieve all the values of the first time tracker in the order of the measurements.

Such an approach being able to offer a usage pattern of the device.

Said memory module being any type of memory module, preferably but not limiting thereto, said memory module is of a non-volatile type.

In another preferred embodiment but not limiting thereto, the memory module has the capacity to store all the values of the first time tracker measured during the preset time interval.

In another embodiment according to the present invention, the wireless communication unit 7 can send the value of the first time tracker to the central controller, the cloud or to the external device.

In another preferred embodiment according to the present invention, when said memory module is full, the communication unit 7 can send all stored values to the central controller, the cloud or the external device and reset the memory module.

Preferably, it will keep the last value of the first time tracker.

In one embodiment according to the present invention, but not limiting thereto, in order to extend the lifetime of the memory module, the memory module is adapted to write the data in different sectors after every reset.

By adopting such a technique, the sectors are protected from damages and it is assured that the memory module will not be full before the preset time interval is reached.

In another embodiment according to the present invention, the communication unit 7 can send the saved values of the first time tracker to a central controller, the cloud or the external device when the capacitor 11 is fully loaded.

In yet another embodiment according to the present invention, the first time tracker further comprises a second counter. Said second counter keeping track of the time in which the device is in an unloaded state.

Accordingly, if the measured current intensity is below the first predetermined threshold but different from zero, the second counter is being incremented.

If the measured current intensity is equal to zero, the processing unit 6 will preferably not increase any counter.

Preferably, the second counter is being incremented in the same manner as the first counter, by considering the last value of the second counter to which a second predetermined value is added. Said second predetermined value preferably being the same as the first predetermined value.

It should be however not excluded that the second predetermined value to be selected as having a different value than the first predetermined value.

Typically, a compressor or vacuum pump is considered as being in an unloaded state when said compressor or vacuum pump is running at very low speed and when the demand on the network to which such compressor or vacuum pump is connected, is very low or absent.

Typically, the unloaded state is considered when the compressor or vacuum pump is running at approximately twenty percent of the nominal power.

It should be further not excluded that said first predetermined value and/or said second predetermined value to be selected as a number or a character indicative of the moment when a servicing is advisable to be performed on the device, but different than the frequency of the measurements.

In another preferred embodiment according to the present invention, the communication unit 7 is adapted to send the current value of the first counter and of the second counter whenever the communication is initiated.

In yet another preferred embodiment, the first time tracker will add the value of the first counter to the value of the second counter, preferably but not limiting thereto, after each measurement of the current.

Preferably, the result of the sum is stored on the memory module and sent through the communication unit 7.

The value of the sum being indicative of the total number of running hours of the device.

In another embodiment according to the present invention, the communication unit 7 is adapted to send the latest value of the sum and at least one of the two: the value of the first counter or the value of the second counter.

It should be however not excluded that both, the value of the first counter and the value of the second counter can be sent together with the result of the sum.

The first counter and the second counter being two software variables of the first time tracker. The first counter being indicative of the amount of time during which the device is maintained in a load state and the second counter being indicative of the amount of time during which the device is maintained in an unload state. In another embodiment according to the present invention, the second module 4 comprises a second time tracker.

Such a second time tracker providing an extra check in order to make sure that the current sensor 1 transmits the value of the first time tracker, after the preset time interval.

Said second time tracker retrieving, either retrieves the real daytime, or being reset every time the communication after the preset time interval takes place, and keeping track of said preset time interval.

In another embodiment according to the present invention and not limiting thereto, the current sensor 1 can send the current value of the first time tracker after the preset time interval and/or all the values of the first time tracker, saved on the memory module, when the capacitor 11 is fully loaded.

In yet another embodiment according to the present invention, the communication unit 7 will only send the values of the first time tracker that were saved since the last communication to the central controller, the cloud or the external device, avoiding duplication of data.

Preferably, but not limiting thereto, the communication unit 7 will send the result of the sum indicative of the total amount of running hours and at least one of the two: the value of the first counter or the value of the second counter to the central controller, the cloud or the external device.

In a preferred embodiment according to the present invention, the current sensor 1 according to the present invention does not comprise a battery module.

In an embodiment of the present invention, the current sensor 1 according to the present invention can be mounted either within the housing (not shown) holding the device, or even outside of such housing.

Because of this, the current sensor 1 according to the present invention is visible and easily accessible.

The current sensor 1 according to the present invention being suitable to be mounted on any type of compressor, vacuum pump or dryer.

Figure 3:
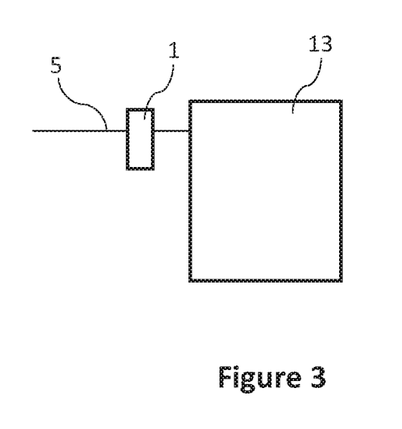
FIG. 3 schematically illustrates a device having a current sensor according to the present invention mounted onto the power cord.

In another embodiment according to the present invention, the current sensor 1 can be mounted on the power cord 5 of a compressed gas network 13 (FIG. 3). Said compressed gas network 13 comprising a compressor element driven by a fixed speed or variable speed electrical motor.

The electrical motor comprising electrical wiring though which electrical energy from the grid or an electrical generator is supplied. Said electrical wiring being either directly or indirectly connected to the power cable 5.

In the context of the present invention, the compressed gas network 13 should be understood as the complete compressor installation, including the compressor element, all the typical connection pipes and valves, the housing of the compressor and possibly the motor driving the compressor element.

In the context of the present invention, the compressor element should be understood as the compressor element casing in which the compression process takes place by means of a rotor or through a reciprocating movement.

In the context of the present invention, said compressor element can be selected from a group comprising: a screw, a toothed, a claw, a scroll, a rotary vane, a centrifugal, a piston, etc.

In another embodiment according to the present invention, the compressed gas network 13 can comprise a compressed gas dryer. The compressed gas dryer comprising a motor having an electrical wire connected thereto or an electrical wire connected to a controller part of the dryer.

Accordingly, the current sensor of the present invention can be mounted either on the electrical wire of the motor or on the electrical wire of the controller and count the running hours of the compressed gas dryer.

In another embodiment according to the present invention, if the compressed gas network 13 comprises two or more devices (not shown), each comprising a motor having an electrical wire or simply an electrical wire supplying electrical energy to their respective electrical circuit, a current sensor 1 according to the present invention can be mounted on each of these electrical wires and count the running hours for each individual device.

Preferably, the current sensor 1 is mounted on a wire of the power cable of a compressor, a vacuum pump or a dryer having a power range of between two kilowatt and twenty-two kilowatt.

Such devices being typically in the low power range, and found for example and not limiting thereto: in a shop for powering pneumatic tools, in a household, or even in an industrial environment.

It should be however not excluded for such current sensor 1 to be used for devices in the high power rage.

It should be however understood that the current sensor 1 according to the present invention is not intended to be mounted on a wire of a power cable of a HVAC system.

For facilitating a very easy mounting on different devices, with different power characteristics, the current sensor 1 according to the present invention further comprises a dip switch (not shown), comprising a number of pre-configured ports, each pre-configured port typically being used for a different compressor, dryer or vacuum pump.

In an embodiment according to the present invention, each port preferably comprises a first pre-determined threshold characteristic for the particular type of compressor, dryer or vacuum pump.

Once the port on the dip switch is selected, the current sensor 1 will retrieve the first pre-determined threshold corresponding to that port and use it for comparison with the measured current intensity.

In another embodiment according to the present invention, the current sensor 1 can comprise a temperature sensor allowing the user to retrieve data concerning the environment in which the device is functioning or regarding the temperature of the device itself.

It is further possible for the current sensor 1 to receive information through a wireless connection from sensors mounted on the device and provide a more detailed analysis of said device.

Accordingly, the user of a current sensor 1 according to the present invention can not only retrieve data concerning the functioning pattern of the device such as: the energy consumption, the number or running hours without the device being switched off, the next planned maintenance, but also information concerning other parameters potentially influencing the functioning capabilities of such device such as: ambient temperature, temperature of the device in different locations, possibly even humidity and dew point.

The functioning of the current sensor 1 is very simple and as follows.

The current sensor 1 is being clamped around a wire part of a power cable 5 of a device such as a compressor or vacuum pump, the current through the wire of the power cable 5 is measured and the measured current is sent to the processing unit 6 through a first communication link 8.

The measurement of the current can be translated into a value before being sent to the processing unit 6, or said processing unit can translate said measurement into a value after it receives it.

Further the processing unit is comparing the measured current intensity with a first predetermined threshold, and if the measured current intensity is above the first predetermined threshold, incrementing the first counter of the first time tracker. The value of the first time tracker being transmitted through the GSM module to a central controller, the cloud or to an external device.

Said external device being any type of device such as for example and not limiting thereto: an external hard drive, a computer, a tablet, a phone, a Personal Digital Assistant (PDA), or the like.

Preferably said external device being able to receive the data though a GSM type of connection.

The processing unit 6 preferably comprising a microprocessor (not shown). Said microprocessor typically being a very low power and low cost type, capable of performing the comparisons and steps mentioned above.

Preferably, the current sensor 1 can be identified through a unique code provided to the GSM module such as for example and not limiting thereto: an International Mobile Equipment Identity (IMEI) code or an Integrated Circuit Card Identifier (ICCID) or any other type of code.

In another embodiment according to the present invention, each device can be provided with a Quick Response (QR) code.

In an embodiment according to the present invention, a user of a current sensor 1 according to the present invention can retrieve information concerning the current value of the first counter and/or the second counter from the cloud or directly from the current sensor 1, by accessing a website and identifying the device by the unique code such as the IMEI code and/or scanning the QR code, or by querying the current sensor 1 by scanning said QR code.

Preferably, the method according to the present invention comprises running an initialization phase for the current sensor 1 during a predetermined time interval, allowing the current sensor 1 to reach a nominal functioning state.

Preferably, in between measurements, for preserving energy, the current sensor 1 is brought in sleep mode.

The method further comprises harvesting electrical energy from the power cable and charging a capacitor 11 part of the second module 4. Typically, after the initialization phase, the current sensor 1 will have charged the capacitor 11 with enough energy to be able to initiate and perform a wireless communication through the GSM module.

In an embodiment according to the present invention and not limiting thereto, said initialization phase can be selected as any value selected between two hours and twenty-four hours, more preferably between two hours and fifteen hours, even more preferably between two hours and eight hours.

Typically, the capacitor 11 should be fully charged or almost fully charged after approximately eight hours.

In another embodiment according to the present invention, the method comprises the step of pre-configuring the ports of the dip switch part of the second module 4 to each comprise a first predetermined threshold.

A user of a current sensor 1 according to the present invention only needing to select the needed port and mount the current sensor 1 on the wire. By doing so, the current sensor 1 is adapted to the particular compressor or vacuum pump he uses.

In one embodiment according to the present invention, the values of the first counter and/or of the second counter that are sent to the cloud or to an external device are being monitored, for helping a user to schedule a maintenance of the device.

Furthermore, if no value is received within a period of time such as, for example and not limiting thereto: a month, two months or a number of weeks, according to the user's requirements, an alert signal can be sent to the user informing him that the device is switched off.

The alert signal being sent to the central controller, the cloud or to an external device monitored by the user.

Said alarm signal being even a text message sent to a mobile phone.

Accordingly, if the device is switched-off for a period of time that would allow the capacitor 11 to get empty, once switched on, the current sensor 1 would require a minimum amount of time for reaching a reasonable charging state.

Tests have shown that if a capacitor 11 is allowed to be fully emptied it would require approximately two hours for the current sensor 1 to be able to function again.

Further preferably, once the device is restarted, the last value of the sum, the first counter and/or the second counter is retrieved from the memory module.

It is further possible for the last sent value of the sum, the first counter and/or the second counter to be retrieved from the central controller, the cloud or the external computer.

Depending on the design of the current sensor 1 and/or said a compressed gas network comprising such a current sensor 1, said current sensor 1 and/or said compressed gas network can comprise some or even all the technical features presented herein, in any combination without departing from the scope of the invention.

By technical features it is meant at least: the housing 2, the first module 3, the second module 4, the processing unit 6, the communication unit 7, the capacitor 11, the mobile section of the housing 2, the energy transformation circuit 10, the third communication link 12, the memory module, the first time tracker, the first counter, the second counter, sending the values after a preset time interval, the second time tracker, the dip switch, the temperature sensor, the microprocessor, the SIM card, the initialization phase, the sleep mode, pre-configuring the ports of the dip switch, etc.

The present invention is by no means limited to the embodiments described as an example and shown in the drawings, but such a current sensor 1 can be realized in all kinds of variants, without departing from the scope of the invention.

The invention claimed is:

1. A current sensor comprising a housing, said housing comprising:
   a first module adapted to be clamped around a wire of a power cable;
   a second module comprising a processing unit and a communication unit;
   said first module further comprising means to measure current through said wire and to send the measured current to the processing unit through a first communication link;
   the processing unit comprising a first time tracker;
   wherein said processing unit further comprises means to increment said first time tracker if the measured current is above a first predetermined threshold and in that the communication unit comprises a GSM module adapted to wirelessly transmit a value of the first time tracker, wherein said first time tracker comprises a first counter and a second counter, said first counter being indicative of an amount of time during which a device is in a loaded state and said second counter being indicative of an amount of time during which the device is maintained in an unloaded state.

2. The current sensor according to claim 1, wherein said housing encloses the first module and the second module.

3. The current sensor according to claim 1, wherein the second module further comprises an energy transformation circuit adapted to harvest electrical energy from the power cable.

4. The current sensor according claim 1, wherein the second module further comprises a capacitor adapted to be charged by the electrical energy harvested.

5. The current sensor according to claim 4, wherein the capacitor is adapted to supply the energy required for the GSM module to wirelessly communicate the value of the first time tracker.

6. The current sensor according to claim 1, wherein the second module further comprises a memory module comprising a data link to the processing unit and adapted to store the value of the first time tracker.

7. The current sensor according to claim 1, wherein the second module comprises a second time tracker.

8. The current sensor according to claim 1, wherein the current sensor does not comprise a battery module.

9. A compressed gas network comprising a motor driving a compressor element and a power cable supplying electrical power to said motor, wherein the compressed gas network comprises a current sensor according to claim 1.

10. A method of using a current sensor according to claim 1, comprising the step of determining the running hours of a compressor or a dryer by using the current sensor.

11. A method for determining the functioning of a device driven by an electrical motor connected to a power cable by measuring current through a wire part of said power cable, the method comprising the following steps:
   providing a current sensor having a housing with a first module and a second module;
   clamping the first module around a wire of the power cable;
   providing a processing unit and a communication unit part of said second module;
   measuring the current through the wire and sending the measured current to the processing unit through a first communication link;
   providing the processing unit with a first time tracker;
   comparing the measured current with a first predetermined threshold and incrementing a first counter of said first time tracker if the measured current is above the first predetermined threshold; and
   transmitting the value of the first time tracker through a GSM module part of the communication unit;
   wherein if the current is below the predetermined threshold, then the method further comprises the step of increasing a second counter of said first time tracker, wherein said first counter is indicative of an amount of time during which a device is in a loaded state and said second counter is indicative of an amount of time during which the device is maintained in an unloaded state.

12. The method according to claim 11, wherein the method further comprises the step of sending the value of the first time tracker to an external device.

13. The method according to claim 11, wherein the method further comprises storing the value of the first counter and/or the value of the second counter onto a memory module part of the current sensor.

14. The method according to claim 11, wherein the method further comprises sending the value of the sum between the first counter and the second counter, and the value of the first counter or of the second counter through said GSM module after a predetermined time interval measured by a second time tracker.

15. The method according to claim 11, wherein the method further comprises running an initialization phase for the current sensor during a predetermined time interval.

16. The method according to claim 11, wherein the method further comprises harvesting electrical energy from the power cable and charging a capacitor part of current sensor.

17. The method according to claim 11, wherein the capacitor is providing the necessary power to the communication unit.

18. The method according to claim 11, wherein the method further comprises the step of pre-configuring ports of a dip switch, part of the second module, such that each port comprises a first predetermined threshold.

19. The method according to claim 11, wherein the method further comprises identifying the current sensor through the IMEI code of the GSM module.

20. The method of claim 11, further comprising the step:
scheduling a servicing of the device driven by the electrical motor.

* * * * *